(12) United States Patent
Liao (10) Patent No.: US 12,165,943 B2
(45) Date of Patent: Dec. 10, 2024

(54) CHIP RETAINING STRUCTURE TO FIX A CHIP MODULE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Fang-Jwu Liao, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 368 days.

(21) Appl. No.: 17/582,173

(22) Filed: Jan. 24, 2022

(65) Prior Publication Data
US 2022/0254698 A1 Aug. 11, 2022

(30) Foreign Application Priority Data
Feb. 5, 2021 (CN) .......................... 202120334726.4

(51) Int. Cl.
*H01R 12/00* (2006.01)
*H01L 23/32* (2006.01)

(52) U.S. Cl.
CPC .................................... *H01L 23/32* (2013.01)

(58) Field of Classification Search
CPC .................................. H01L 23/32; H05K 7/10
See application file for complete search history.

(56) References Cited

U.S. PATENT DOCUMENTS

| | | | | |
|---|---|---|---|---|
| 6,560,113 B1* | 5/2003 | Ma | .................. | H01L 23/4006 24/457 |
| 8,070,495 B2* | 12/2011 | Fan | .................. | H01R 13/73 439/61 |
| 11,831,094 B2* | 11/2023 | Cheng | .................. | H01R 12/716 |
| 2004/0047130 A1* | 3/2004 | Liu | .................. | H01L 23/4006 257/E23.084 |
| 2009/0004893 A1* | 1/2009 | Fan | .................. | H05K 7/1007 439/74 |
| 2020/0396825 A1* | 12/2020 | Wu | .................. | G06F 1/20 |
| 2022/0131292 A1* | 4/2022 | Cheng | .................. | H01R 12/7047 |

FOREIGN PATENT DOCUMENTS

CN 211980932 U 11/2020

* cited by examiner

*Primary Examiner* — Abdullah A Riyami
*Assistant Examiner* — Nelson R. Burgos-Guntin
(74) *Attorney, Agent, or Firm* — Ming Chieh Chang (57) ABSTRACT

A chip retaining structure adapted for fixing a chip module in a chip socket includes a seat frame, a load plate and two retaining groups. The load plate is assembled on the seat frame and pivotable relative to one side of the seat frame. The load plate defines at least two through holes. Each through hole has a flange protruding inwardly adjacent to an upper face of the load plate. Each retaining groups comprises a bolt, a nut, and a collar. The bolt includes a nut portion, a first cylinder portion, a second cylinder portion, and a threaded portion. The nut is retained in the seat frame and screwed with the threaded portion. The collar is sleeved on the second cylinder portion and defines a flange portion. The bolt is limited in an up and down direction by the nut portion and the flange portion of the collar.

11 Claims, 10 Drawing Sheets

CHIP RETAINING STRUCTURE TO FIX A CHIP MODULE

BACKGROUND OF THE DISCLOSURE

1. Field of the Disclosure

The invention is related to a chip retaining structure which is adapted to fix a chip module in a chip socket.

2. Description of Related Arts

Generally, a chip socket is provided with a load plate which rotates to cover against the chip module received in the socket and the retaining structures like, multiple bolts to fasten the load plate to the chip connector or PCB on which the socket is mounted or back plate mounted on a back face of the PCB. Sometimes, during a bolt is screwed into corresponding nut on the back plate, the unfixed bolts may move closer to corresponding nuts due to an movement of the load plate, resulting in the unfixed bolts being pushed out of the load plate and lost.

It is desired to provide an improved retaining structure to avoid said risks.

SUMMARY OF THE DISCLOSURE

A chip retaining structure adapted for fixing a chip module in a chip socket comprises: a seat frame; a load plate assembled on the seat frame and pivotable relative to one side of the seat frame, the load plate defining at least two through holes, each through hole having a flange protruding inwardly adjacent to an upper face of the load plate; and two retaining groups each comprising a bolt, a nut, and a collar; wherein the bolt comprises a nut portion, a first cylinder portion, a second cylinder portion, and a threaded portion; the nut is retained in the seat frame and to be screwed with the threaded portion; the collar is sleeved on the second cylinder portion and defined a flange portion; and the bolt is limited in an up and down direction by the nut portion and the flange portion of the collar.

DETAILED DESCRIPTION OF THE PREFERRED EMBODIMENT

Refer to FIG. 1 to FIG. 10, a chip retaining structure 100 for fixing a chip module (not shown) in a chip socket (not shown), comprises a seat frame 1 which is used to be assemble on a printed circuit board (PCB), a load plate 2, a plurality of bolts 3 and nuts 4 and collars 5. The load plate 2 is assembled to one side of seat frame 1 and can be rotated relative to the one side of the seat frame 1. An insulating housing (not shown) with the conductive terminals in array is welded on the PCB and surrounded and fixed in the seat frame 1, thereby constructing a chip socket to receive the chip module therein. The detailed structure of the housing is not drawn in this figure. The bolts 3, nuts 4 and collars 5 cooperate together to fix the load plate 2 on the seat frame 1 after the chip module is received in the chip socket. One bolts 3, one nut 4 and one collar construct one a retaining group, in this embodiment, at least four retaining group are provided at four corners of the load plate 2.

The nuts 4 with inside screw threads are fixed on the seat frame 1. The load plate 2 defines a plurality of through holes 21. The through hole 21 has an inwardly protruding flange 211 adjacent to the upper surface of the load plate 2. The bolt 3 sequentially includes a nut portion 31, a first cylinder portion 32, a second cylinder portion 33 with smooth faces and a threaded portion 34. The collar 5 is sleeved on the second cylinder portion 33 and fixed by interference. Alternatively, the bolt and the collar can be attached together by other method, such as, be glued. The collar 5 abut against the flange 211 of the through hole 21 when the bolts 3 move upwardly to a limited point, thereby keep the bolt 3 in the load plate, not be pushed out of the load plate 2.

Figure 1:
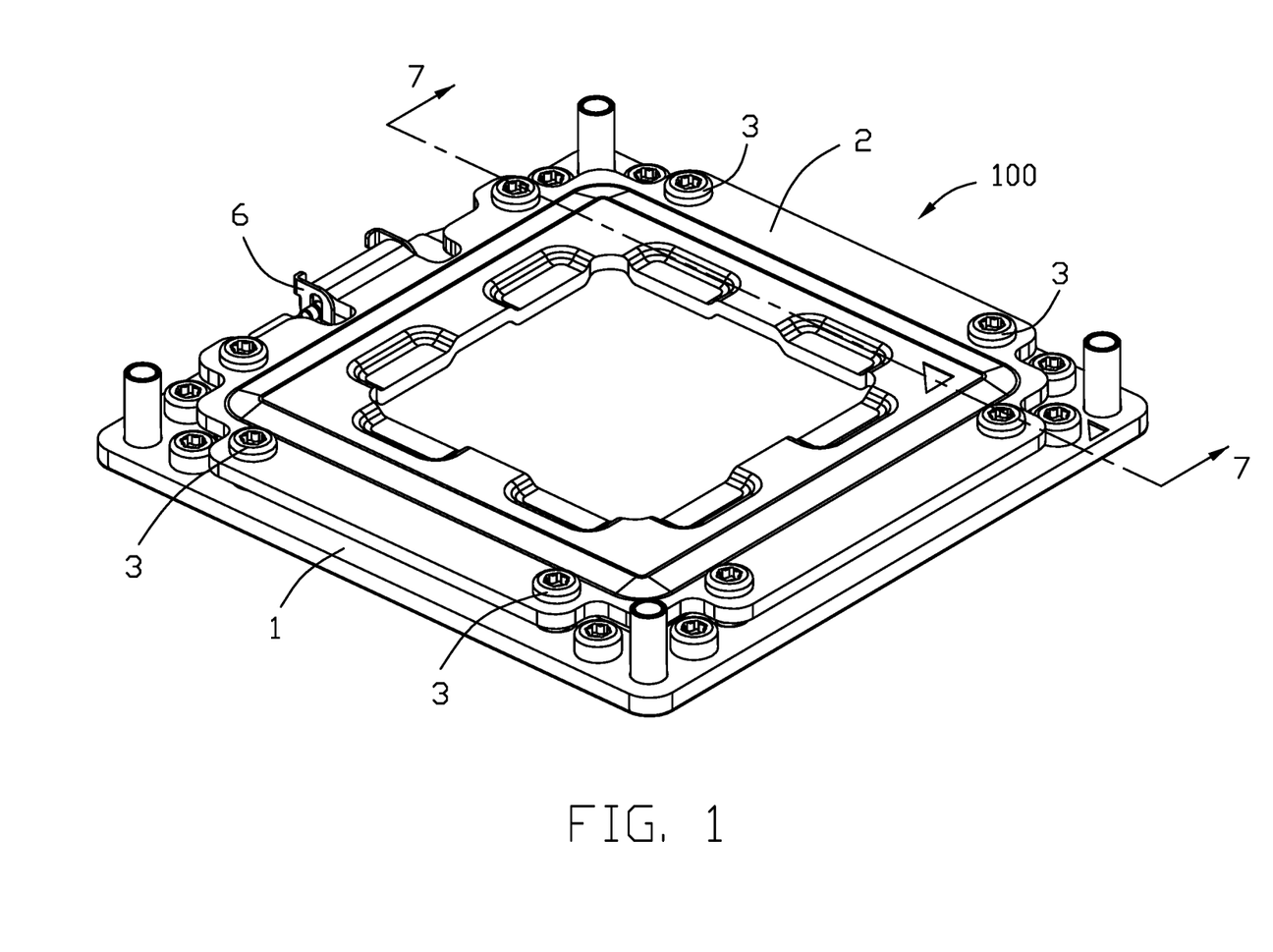
FIG. 1 is a perspective view of a chip retaining structure of this embodiment of the invention.
Figure 2:
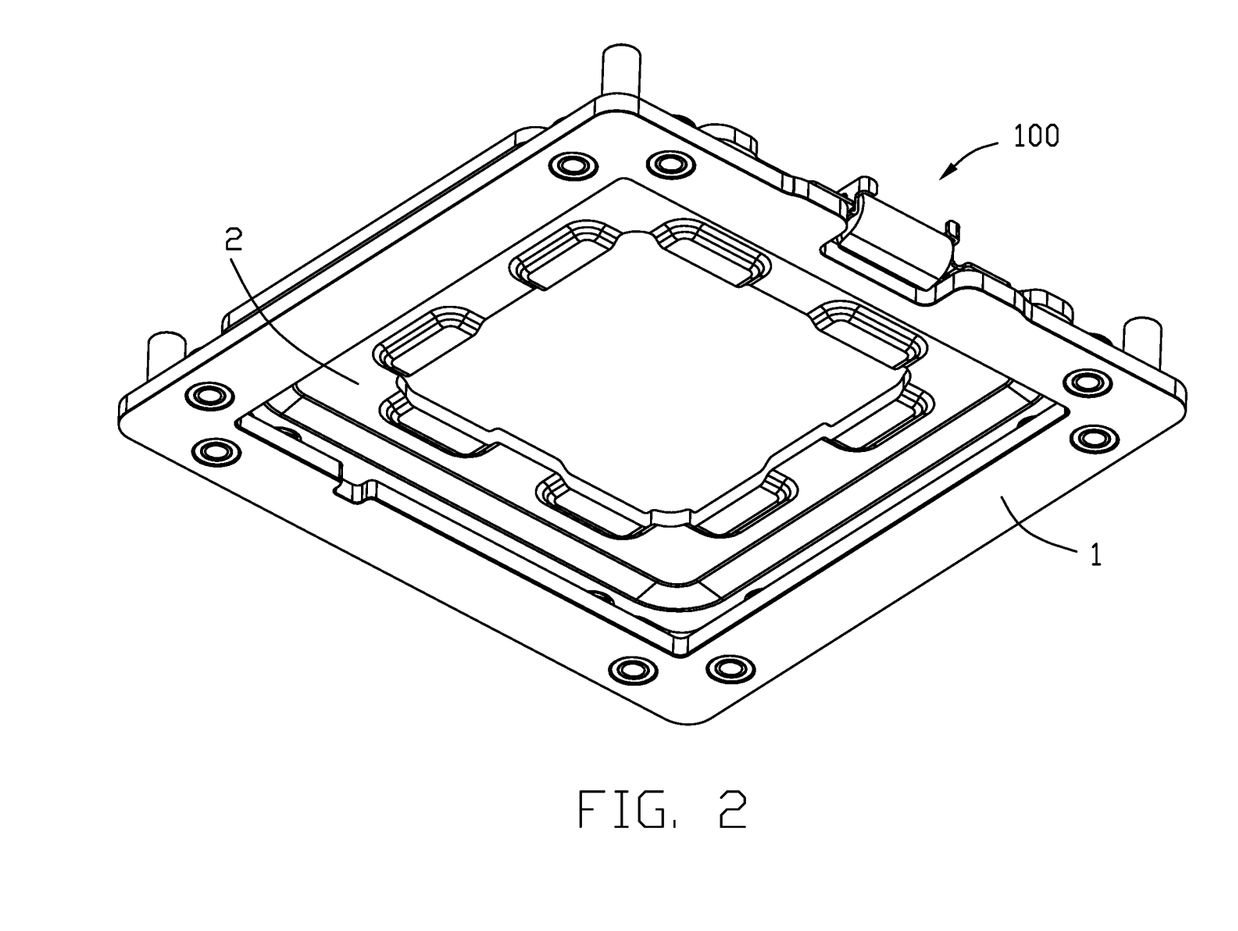
FIG. 2 is another perspective view of the chip retaining structure of FIG. 1.
Figure 3:
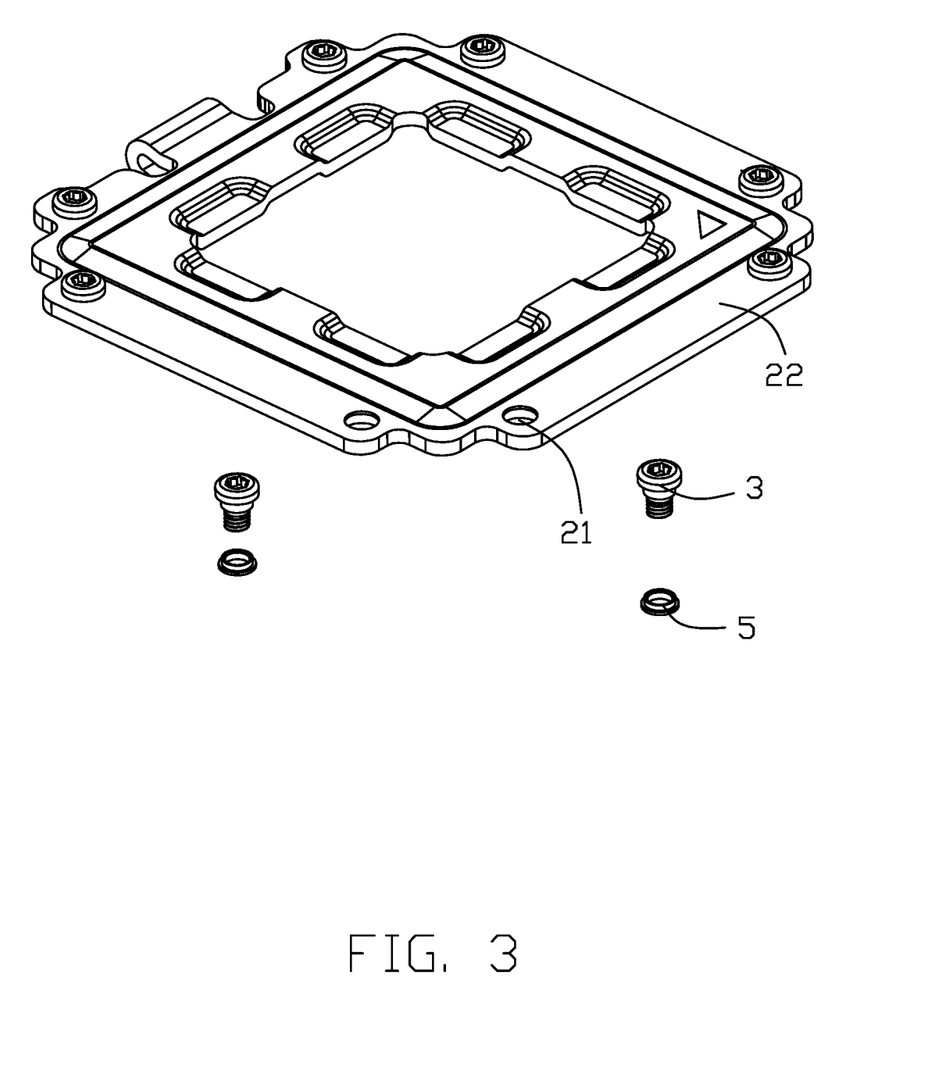
FIG. 3 is a perspective view of a load plate of the chip retaining structure of FIG. 1 with some of the bolts and collars disconnecting from load plate.
Figure 4:
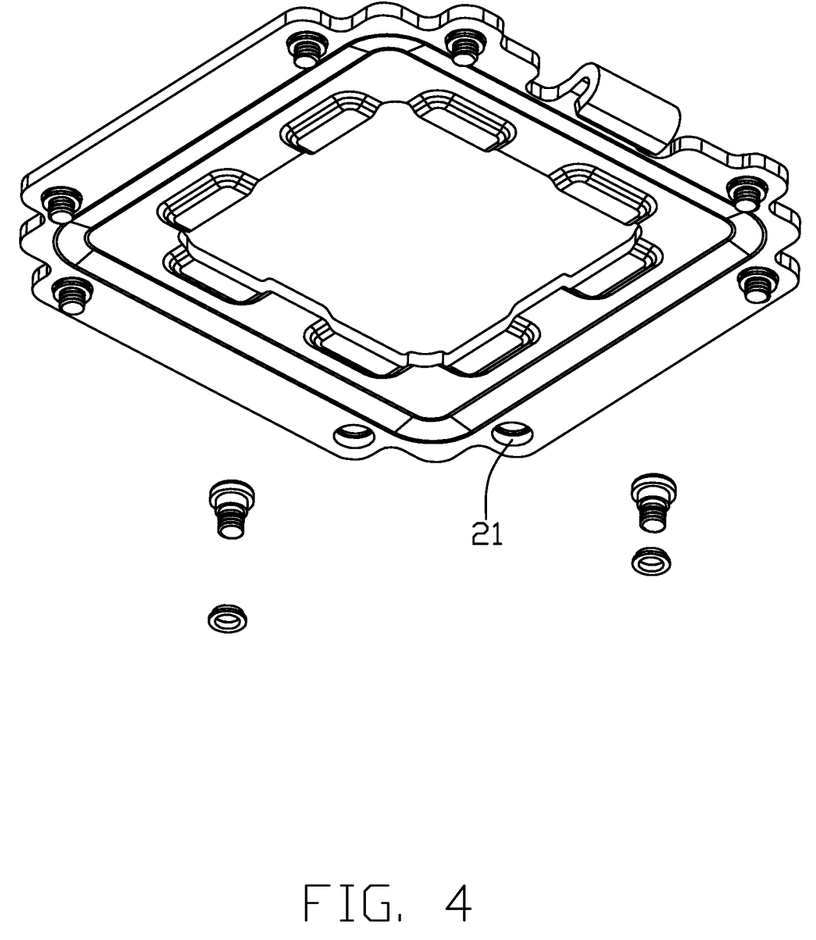
FIG. 4 is another perspective view of the load plate of FIG. 3.
Figure 5:
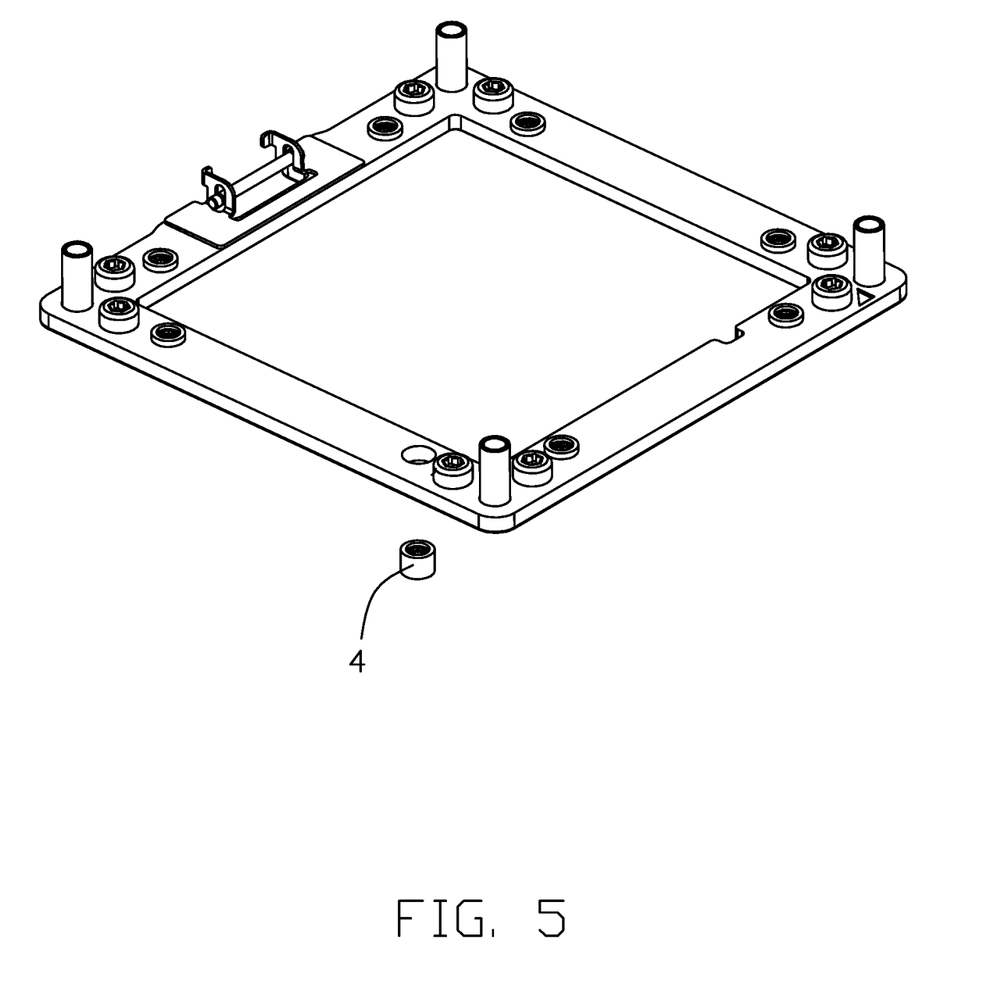
FIG. 5 is a perspective view of a seat frame of the chip retaining structure of FIG. 1.
Figure 6:
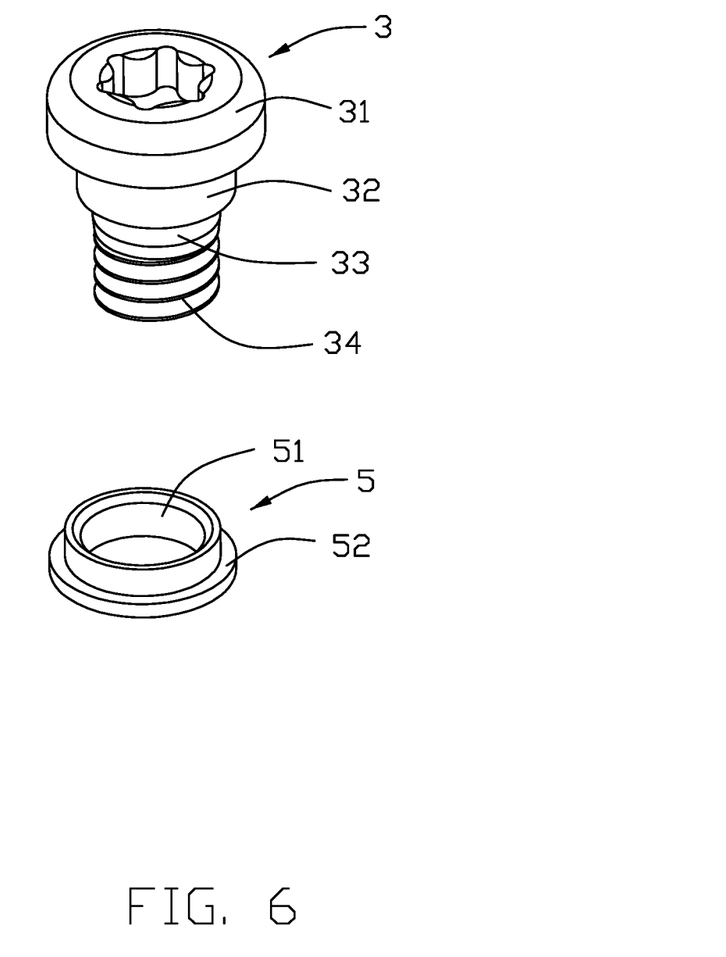
FIG. 6 is a perspective view of the bolt and the collar of the chip retaining structure of FIG. 3.
Figure 7:
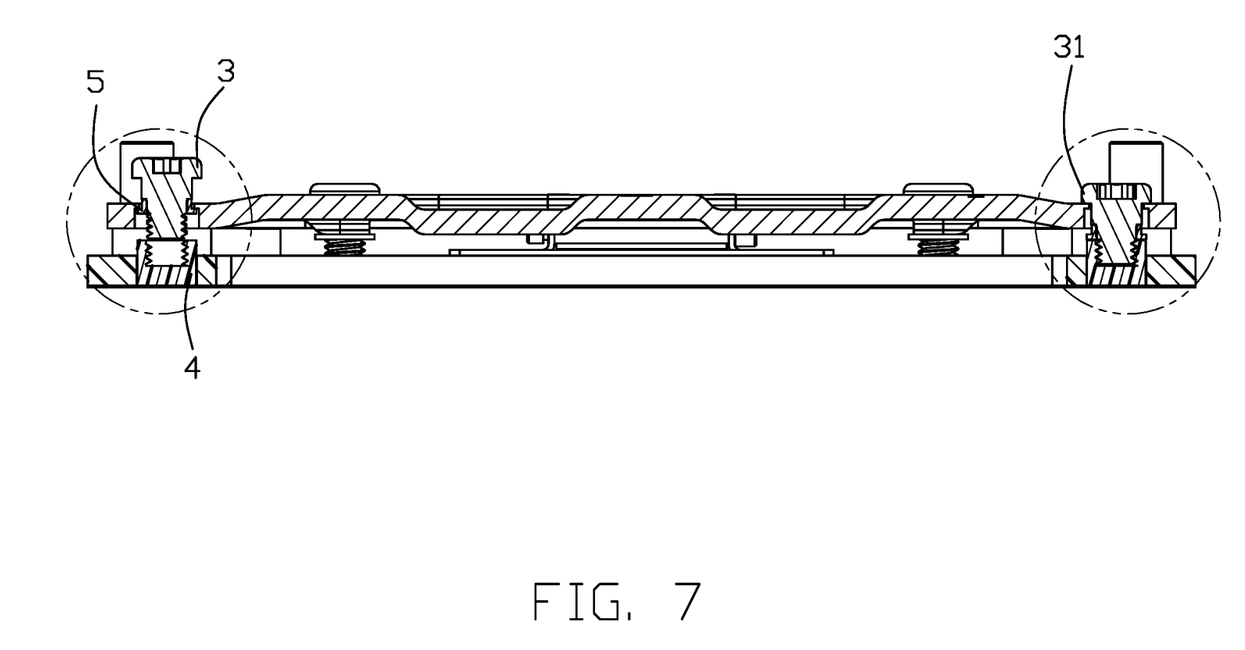
FIG. 7 is a cross-sectional view of the chip retaining structure taken along line 7-7 in FIG. 1.
Figure 8:
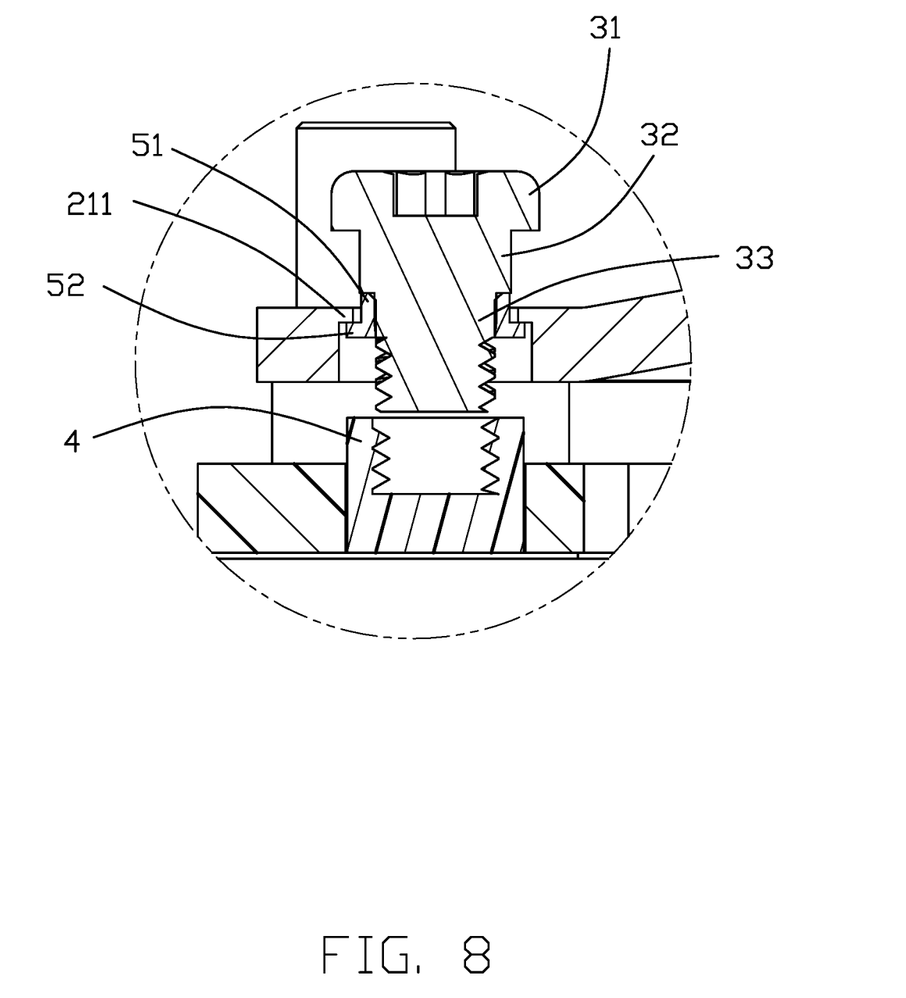
FIG. 8 is a partial enlarged view of the bolt located at the highest position of FIG. 7.

As best shown in FIGS. 6 and 8, the collar 5 includes a tube portion 51 and a flange portion 52 protruding outwardly from a bottom of the tube portion 51. The flange portion 52 of the collar 5 and the flange 211 of the through hole 21 abut against each other. The tube portion 51 is fixed by interference with the second cylinder portion 33 of the bolts 3, and the diameter of the tube portion 51 is not larger than the diameter of the first cylindrical portion 32. In this embodiment, the diameter of the first cylinder portion 32 is larger than the diameter of the second cylinder portion 33, so as to form a stepped surface 35 between the first cylinder portion 32 and second cylinders portion 33, and the tube portion 51 abuts against the stepped surface 35 upwardly.

Figure 10:
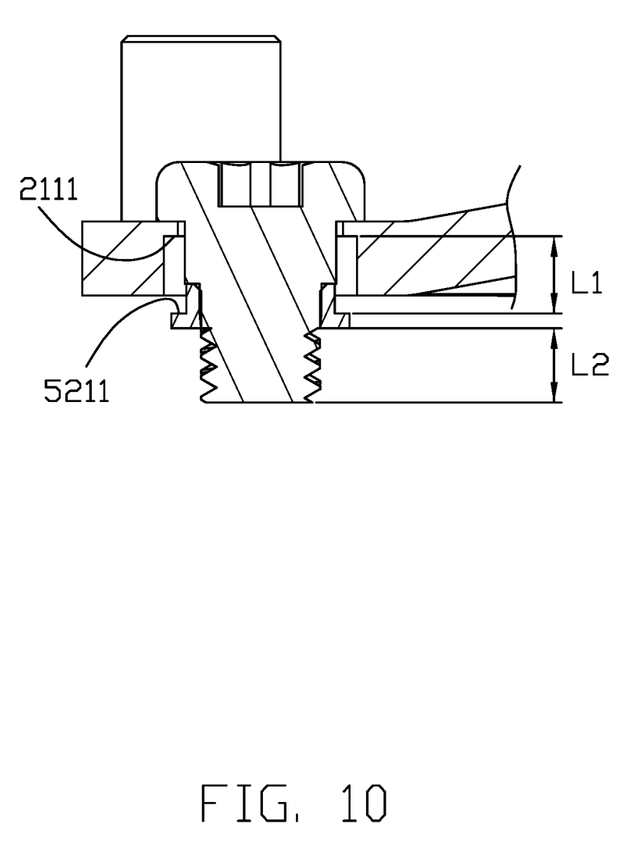
FIG. 10 is a sketch view shown the bolt on the load plate in a free statue before the load plate arrived at the nut.

Before the bolts 3 arrive at the top of the nuts 5 as best shown in FIG. 10, the bottom face of the nut portion 31 of the bolts abut against the top face of the hole 21 of the load plate 2 due to the gravity force of the bolts. At that moment, an upright distance is defines between the bottom face 2111 of the flange 211 of the through hole 21 and the upper face 5211 of the flange portion 52 of the collar 5, which is defined as the first distance L1, and the first distance L1 is greater than 2.5 mm. In this embodiment, the first distance L1 is equal to 2.6 mm. When the bolts 3 arrive to the top of the nuts and one bolt is screwed into corresponding nuts and other bolts are not screwed, the load plate 1 is pushed downward near to the seat frame 1 while the other bolts 3 are blocked by the top face of the nuts 3 as best shown in FIG. 8. Therefore, the other bolts 3 move upward relative to the load plate 2 until the top face 5211 of the flange portions 52 abut against the bottom faces 2111 of the flange 211. Then, the other bolts 3 are screwed in corresponding nuts 4 one by one. The moving distance of the threaded portions 34 screwing into corresponding nuts is defined a second distance L2, the second distance is not more than 2.5 mm, and is equal to 2.5 mm in this embodiment.

In the first distance, the bolts can float up and down freely, and simultaneously keep the bolts on the load plates. Please notes, the first distance must be greater than the second distance L2. In this way, when one bolt 3 is screwed into the nut 4, the other unfixed bolts 3 can be allowed to lift up and the collar 5 still keep on the bolts.

Figure 9:
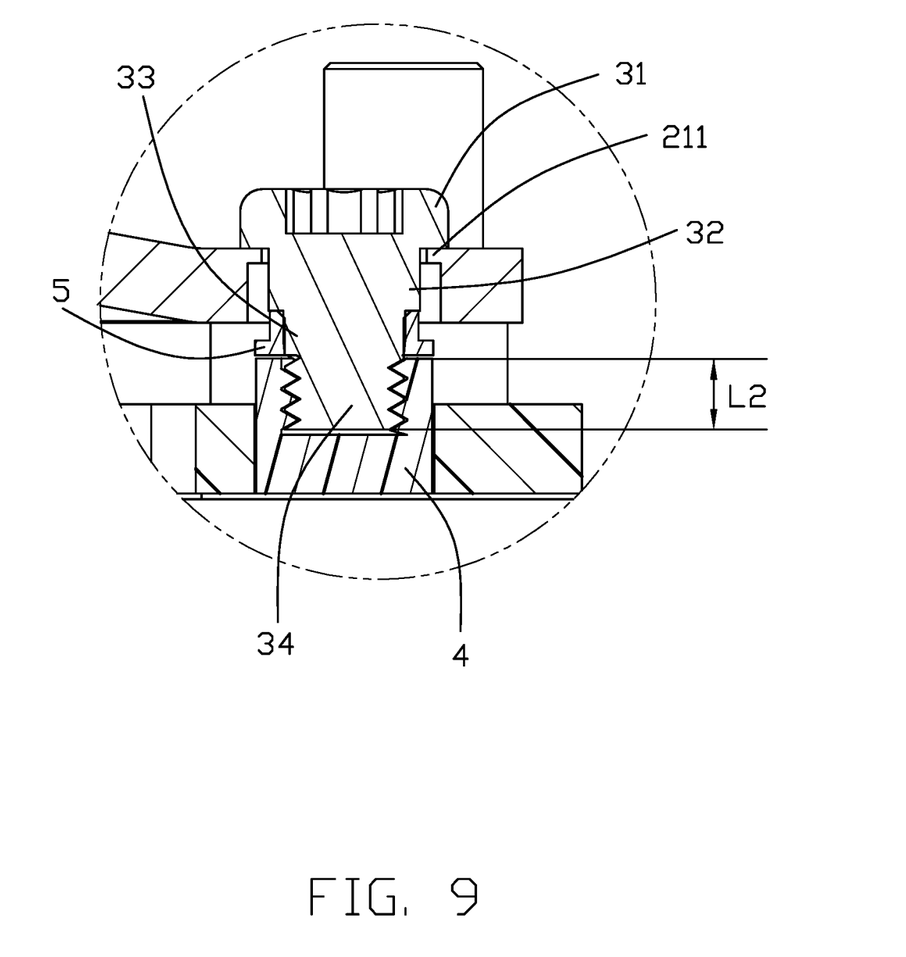
FIG. 9 is a partial enlarged view of the bolt located at the lowest position of FIG. 7.

Refer to FIGS. 8 and 9, when the collar 5 is located at a highest position, the top face of the tube portion 51 protrudes upwardly from the upper face of the load plate 2. When the collar 5 is located at the lowest position, the flange portion 52 of the collar 5 protrudes downwardly from the lower face of the load plate 2.

The retaining structure 100 further includes a pivoting device 6 disposed on the seat frame 1. The load plate 2 is assembled to the seat frame 1 by means of the pivoting device 6. The load plate 2 has four frame edges 22 for holding the chip module. Each longitudinal end of each frame edge 22 has a bolt 3 and a collar 5. The bolts 3 and the collar 5 on the four frame edges 22 are arranged symmetrically.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. A chip retaining structure adapted for fixing a chip module in a chip socket, comprising:
    a seat frame;
    a load plate assembled on the seat frame and pivotable relative to one side of the seat frame, the load plate defining at least two through holes, each through hole having a flange protruding inwardly adjacent to an upper face of the load plate; and
    two retaining groups for fastening the load plate to the seat frame, each retaining group comprising a bolt, a nut, and a collar; wherein
    the bolt comprises a nut portion, a first cylinder portion, a second cylinder portion, and a threaded portion;
    the nut is retained in the seat frame and to be screwed with the threaded portion;
    the collar is sleeved on the second cylinder portion and has a flange portion;
    the bolt is limited in an up and down direction by the nut portion and the flange portion of the collar; and
    a first distance is defined between the bottom face of the flange and an upper face of the flange portion of the collar, the threaded portion is screwed into the nut with a second distance, and the first distance is greater than the second distance.

2. The chip retaining structure as claimed in claim 1, wherein the collar comprises a tube portion, the flange portion protrudes outwardly from a bottom of the tube portion, and the tube portion is retained around the second cylinder portion.

3. The chip retaining structure as claimed in claim 2, wherein the nut portion is fixed by an interference with the second cylinder portion, and a diameter of the nut portion is not larger than a diameter of the first cylindrical portion.

4. The chip retaining structure as claimed in claim 1, wherein the first distance is greater than 2.5 mm.

5. The chip retaining structure as claimed in claim 1, wherein the first distance is 2.6 mm.

6. The chip retaining structure as claimed in claim 4, wherein the second distance is not more than 2.5 mm.

7. The chip retaining structure as claimed in claim 1, wherein a diameter of the first cylinder portion is larger than a diameter of the second cylinder portion, thereby forming a stepped surface, and the tube portion abuts against the stepped surface upwardly.

8. The chip retaining structure as claimed in claim 2, wherein when the collar is located at a highest position, a top face of the tube portion protrudes upwardly from an upper face of the load plate, and when the collar is located at a lowest position, the flange portion of the collar protrudes downwardly from a lower face of the load plate.

9. The chip retaining structure as claimed in claim 1, further comprising a pivoting device disposed on the seat frame, wherein the load plate is assembled to the seat frame by means of the pivoting device.

10. The chip retaining structure as claimed in claim 1, wherein the load plate has four frame edges for holding the chip module, and the bolts and the collars on the four frame edges are arranged symmetrically.

11. A chip retaining structure adapted for fixing a chip module in a chip socket, comprising:
    a seat frame and a load plate assembled on the seat frame and pivotable relative to the seat frame;
    the load plate defining a plurality of through holes, each through hole having a flange protruding inwardly;
    a plurality of nuts retained on the seat frame;
    a plurality of bolts each comprising a nut portion and a threaded portion extending through a corresponding through hole for being screwed into a corresponding nut; and
    a respective collar provided on each of the plurality of bolts;
    wherein each collar is provided with a flange portion situated between the nut portion and the threaded portion, the bolt is limited to travel in an up and down direction by the nut portion or the flange portion abutting against the flange of the through hole; and
    wherein the threaded portion of the bolt extends downwardly beyond the flange portion of the collar a distance less than a traveling distance of the bolt.

* * * * *